United States Patent [19]

Yates

[11] Patent Number: 4,751,895
[45] Date of Patent: Jun. 21, 1988

[54] DOOR CLOSURE APPARATUS FOR ENCAPSULATING A WAFER PADDLE

[76] Inventor: Cleon R. Yates, 3410 Andtree, Austin, Tex. 78724

[21] Appl. No.: 771,807

[22] Filed: Sep. 3, 1985

[51] Int. Cl.[4] ..................... C23C 16/00; B05C 11/115
[52] U.S. Cl. .................................. 118/728; 118/500; 118/733
[58] Field of Search ........................ 118/733, 728, 500

[56] References Cited

U.S. PATENT DOCUMENTS 4,137,865 2/1979 Cho ...................................... 118/724
4,487,161 12/1984 Hirata et al. .................... 118/733 X Primary Examiner—Evan K. Lawrence
Attorney, Agent, or Firm—John Nevin Shaffer, Jr.

[57] ABSTRACT

A door closure apparatus for processing a wafer paddle used to support microchips in a process tube using the chemical vapor deposition process. The device has a flexible joint which enables the sealing door to squarely seat against a processing tube whether or not the processing tube is correctly aligned. Further, the device has an adapter which enables paddles with variously shaped handles to be accepted in the standard processing tube as if the handles were round.

8 Claims, 3 Drawing Sheets

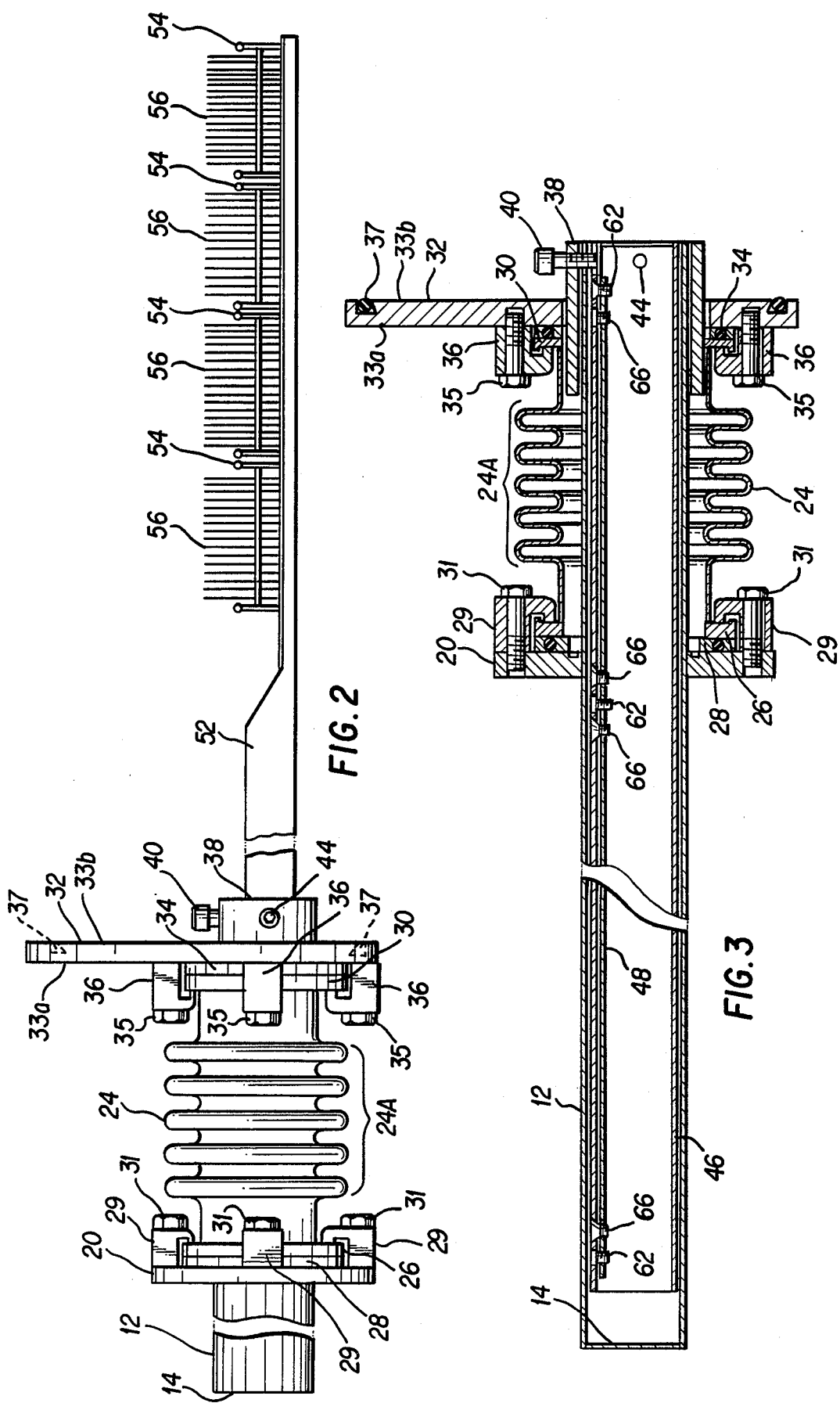

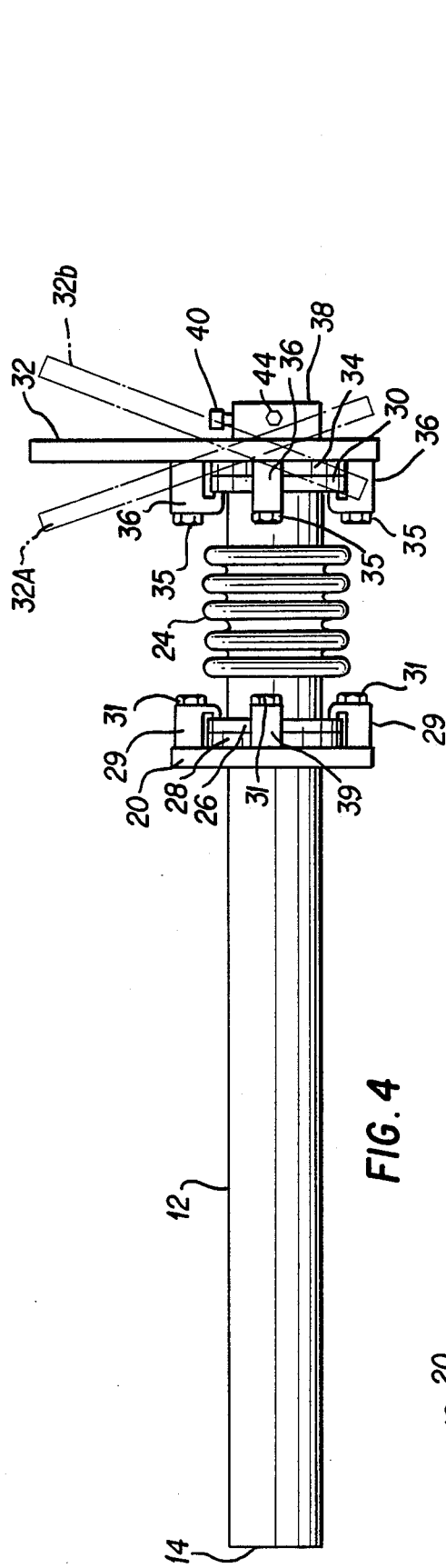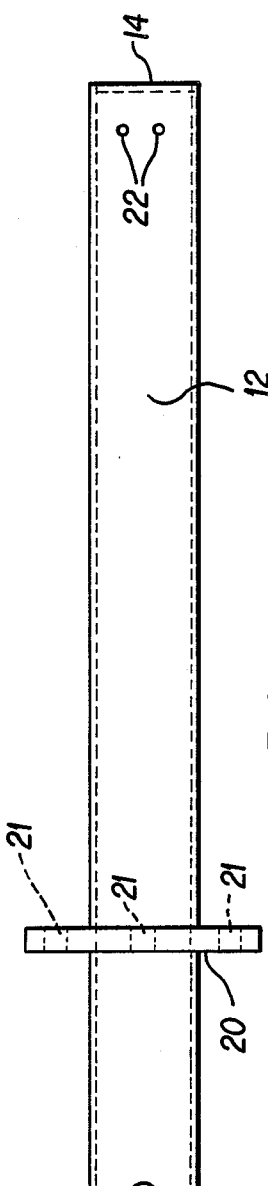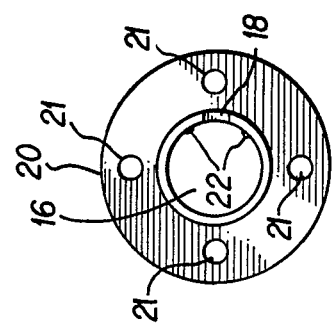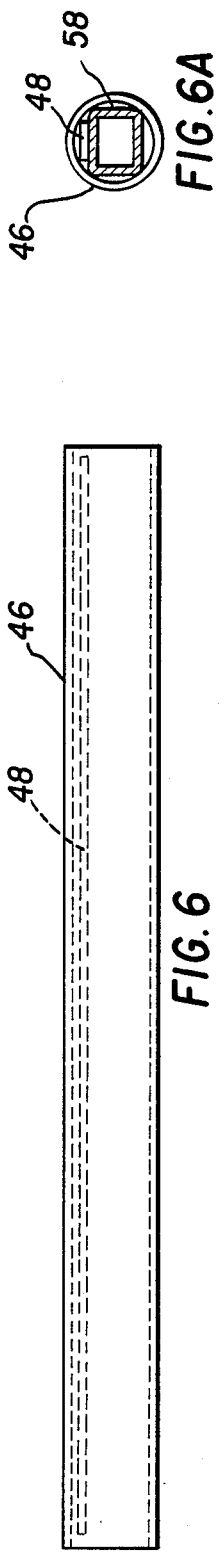
FIG. 4
FIG. 5
FIG. 5A
FIG. 6
FIG. 6A

DOOR CLOSURE APPARATUS FOR ENCAPSULATING A WAFER PADDLE

BACKGROUND OF THE INVENTION

This invention relates to an improved low pressure door closure device for providing a positive seal to process tubes wherein silicon wafers are heated and subjected to various chemical processings. The apparatus provides means for encapsulating a wafer paddle when the paddle is inserted into a process tube.

During the processing of microchips using the chemical vapor deposition (CVD) type system, maintaining a controlled environment is essential. It is essential that the process tube be kept absolutely clean. To accomplish this, the interior of the tube is cleaned and then evacuated. Next, silicon wafers are placed in a carrier or "boat", and then the boats themselves are placed on some type of instrument to introduce the boats to the processing tube. This instrument is normally called a "paddle". Paddles are utilized to hold and support the wafers while they are being processed inside the evacuated process tube. During this processing, the atmosphere must be controlled by first evacuating the tube completely and then entering certain desired gases. It is essential to assure that oxygen and other undesirable gases are prevented from entering the tube. The introduction of undesired gases during processing would ruin the processing and thus destroy the wafers. Presently, the state of the art concerning sealing the processing tube around the area where the paddle is introduced consists primarily of passing the paddle through a structure which meets the dimensions of the processing tube to seal it from the outside. The crucial element, however, is to create an effective seal around the shaft handle of the paddle. Conventional methods use compression, "O" ring, seals which are pressed against the shaft handle of the paddles. The seals are connected to the structure which seals the processing tube itself and thus a vacuum seal is created in the processing tube. There are several problems associated with this type of conventional door closure apparatus. The primary problem is that the extememe heat of processing is transferred through the paddle to the paddle shaft handle and thence to the "O" ring thereby causing the "O" ring to overheat and break down. Once the "O" ring on the paddle handle has burned, there is no assurance that a vacuum can be maintained and costly wafers may be lost inadvertently. The temperature of the process may range from between 600 and 800 degrees centigrade inside the processing tube and significantly high temperatures are also transmitted along the paddle handle.

A further drawback is that this type of compression "O" ring seal around the paddle handle is not practical with square paddle handles, of which there are a significant number. A further drawback is that loss of heat through the paddles causes the processing system to be less efficient than it could be if no such loss were allowed. It, therefore, is an object of this invention to provide an improved low pressure door closure apparatus and method for providing a positive seal about the handle of paddles such that compression "O" ring breakdown due to heat transfer is avoided.

SUMMARY OF THE INVENTION

Accordingly, the low pressure door closure device of the present invention includes a sealed paddle receiving means into which the paddle handle is inserted. A flexible joint is attached to an outer ring on the sealed paddle receiving means on one end and to a sealing door on the other end. The sealed paddle receiving means extends through the receiving door so that the paddle end holding the boat and the wafers will extend into a processing tube. A spacer is provided that slips over the end of the sealed paddle receiving means between the open end of the paddle means and the sealing door at the point that they meet. This spacer has two functions. The first function is to limit the amount of movement of the sealed paddle receiving means so that the flexible connection is not overstressed. Additionally, the spacer provides a place of purchase for a set screw to be installed such that the set screw will screw through the spacer and into an open slot in the end of the sealed paddle receiving means and then into restraining contact with the paddle itself. This provides a way of retaining the paddle within the paddle receiving means. Near the closed end of the paddle receiving means two indentations at two and ten o'clock are made. These indentations help provide a locking effect on the extreme end of the paddle handle when placed in the sealed paddle receiving means so that the paddle does not move or slip in the receiving means. If the paddle being used is round, no modification to the applicant's tubular sealed paddle receiving means is necessary. Should a square handled paddle, or a handle of some other shape, be utilized, an adapter is provided which is nearly the length of the sealed paddle receiving means itself. It has a somewhat smaller diameter and therefore slips easily within the sealed paddle receiving means. Additionally, the adapter has an adapter rod located inside the adapter which, for square handles, "squares" the inside of the tube so that the square handled paddle will fit securely therein. Once the square handled paddle is secured in the adapter, the adapter is inserted in the sealed paddle receiving means and held in place by retaining screws. As a result, a door closure apparatus for encapsulating a wafer paddle is provided so that no contact between the paddle and a gasket is ever made.

BRIEF DESCRIPTION OF THE DRAWINGS

Other objects, features and advantages of the present invention will become more fully apparent from the following detailed description of the preferred embodiment, the appended claims and the accompanying drawings in which:

FIG. 2 is a partial section side view of the device illustrating the paddle and a loaded boat;

FIG. 3 is a side section view of the device of the present invention;

FIG. 4 is a side view of the device with phantom lines showing an exaggerated ability of the device to flex;

FIG. 5 is a partial section top view of the sealed paddle receiving means; FIG. 5A is a view from the open end of said paddle receiving means;

FIG. 6 is a partial section view of the adapter tube for other than round handled paddles; and FIG. 6A is an end view of the adapter showing a cross section of an adaptor rod for square handled paddles and a square handled paddle located therein.

DETAILED DESCRIPTION OF THE PREFERRED EMBODIMENT

Figure 1:
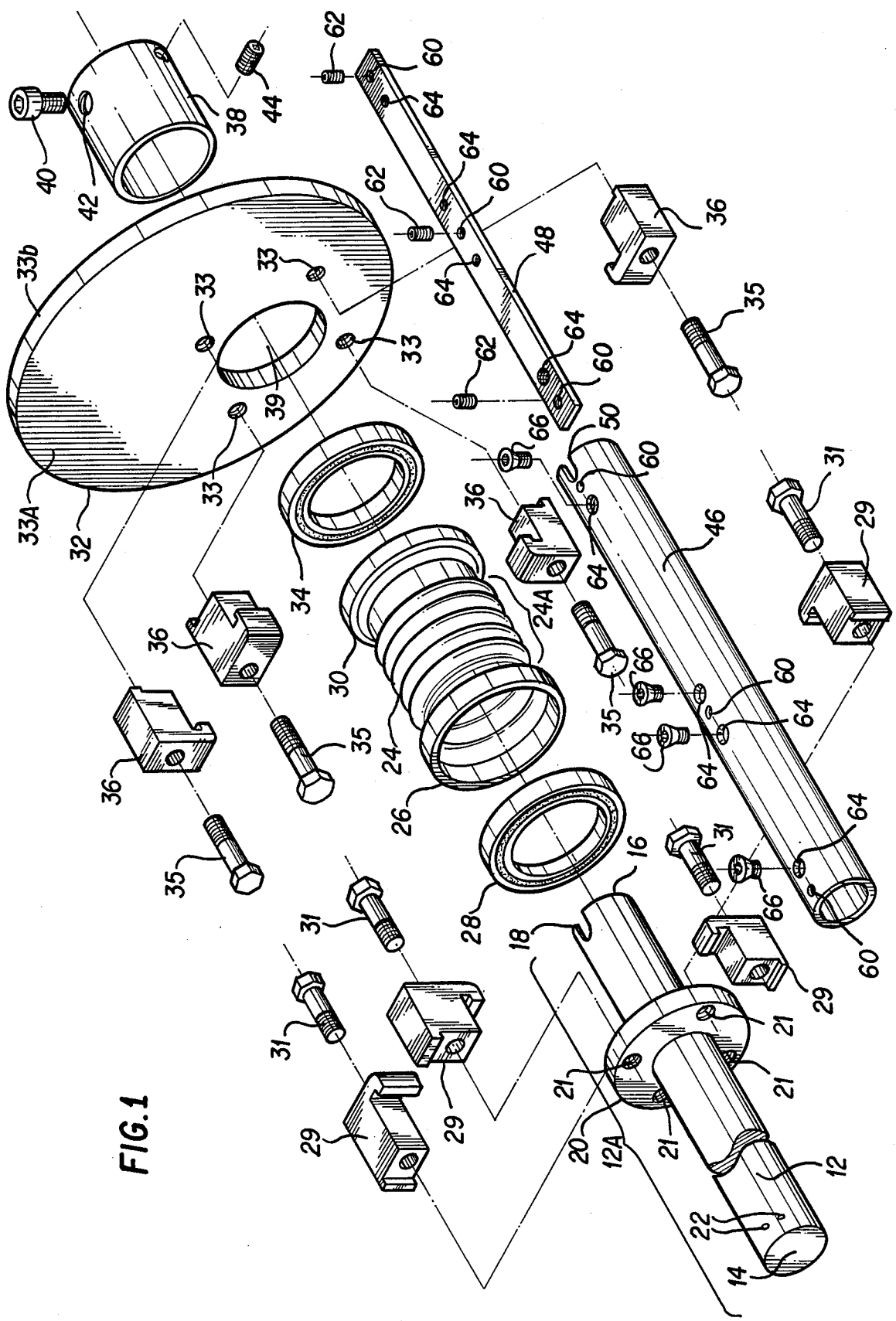
FIG. 1 is an exploded view of a preferred embodiment of the total encapsulated door closure apparatus.

The preferred embodiment of the present invention is illustrated by way of example in FIGS. 1–6A. With specific reference to FIG. 1, the device 10 is shown in exploded view. The sealed paddle receiving means 12 is shown in 12A with closed end 14 and open end 16. Also shown are slot 18 and retention plate 20. Slot 18 is provided in order to enable a retaining set screw 40 to reach and hold a paddle handle 52 once the paddle is inserted in the sealed paddle receiving means 12. Retaining plate 20 is securely attached, by welding or some other known means, to sealed paddle receiving means 12 in order to provide an attachment base for a flexible bellows joint section 24 to be discussed further hereafter. Also, a plurality of attachment receiving means 21 are provided in retention plate 20 for the purpose of securing the flexible bellows joint section 24 by use of securing screw means 31. Finally, anti-slip indentations 22 are shown which are designed to grip a paddle which has been inserted into and encapsulated by the sealed paddle receiving means 12 and to help prevent the paddle from rotating once inserted.

Flexible joint end 26 is illustrated and, as shown, is designed to slip over open end 16 of sealed paddle receiving means 12 after a removably insertable sealing gasket 28. Once flexible joint end 26 and insertable sealing gasket 28 are in place a plurality of removable attachments 29 are used to grip the lip on flexible joint end 26 and pull it tightly towards retaining plate 20 so that a complete, leak proof seal is provided. Removably insertable sealing gasket 28 is of conventional design known in the art and is not disclosed here in detail. Opposite end 30 of flexible bellows joint section 24 also slips over open end 16 of sealed paddle receiving means 12. Sealing door 32 has an outside surface 33a and an inside surface 33b that seals against the processing tube. As sealed paddle receiving means 12 is inserted through sealing door 32, by way of paddle port 39, removably insertable sealing gasket 34 is sandwiched between end 30 of flexible bellows joint section 24 and the sealing door 32 and held in place by a plurality of removable attachments 36 which operate in a manner similar to removable attachments 29. With attachments 36 in place with the T-shaped end of said attachment 36 locked in back of the lip end 30 of flexible bellows joint section 24 a complete, leak proof seal is provided. A corresponding number of attachment receiving holes 33 are provided in sealing door 32 to receive attachments 36 and securing screws 35. A compression gasket sealing means 37, (see FIG. 3), is located on the inside 33b of sealing door 32. Removable insertable sealing gaskets 34 and 28 are of conventional design known in the art and are therefore not disclosed herein in detail.

Also illustrated in FIG. 1 is spacer 38. Spacer 38 is fitted over open end 16 of sealed paddle receiving means 12 as the sealed paddle receiving means 12 is inserted through paddle port 39 in sealing door 32. Spacer 38 also projects through paddle port 39 in sealing door 32 and into flexible joint 24 a short distance. Spacer 38 provides an inhibiting effect to the movement of sealed paddle receiving means 12 so that flexible joint 24 is not over stressed. Additionally, spacer 38 provides the purchase for set screw 40 in set screw opening 42 in spacer 38 so that set screw 40 can be screwed through spacer 38 and through sealed paddle receiving means slot 18 and into contact with a paddle 52 inserted therein in order to insure that the paddle 52 does not move. Two oppositely positioned set screws 44 are provided on opposite sides of spacer 38 in order to retain spacer 38 in secure contact with sealed paddle receiving means 12. Only one set screw 44 is illustrated in FIG. 1.

Also illustrated in FIG. 1 is adapter 46 which is open at both ends. Adapter 46 has an adapter rod 48 which is primarily rectangular in shape and which is secured in position inside adapter 46 as more fully described in FIG. 6. Once in place, adapter rod 48 makes a flat surface in the previously round opening in adapter 46. By means of set screws, or ordinary design and not shown herein, a square handled paddle may be inserted and retained in place within adapter 46. Once this has been accomplished, adapter 46 is designed to be inserted completely within sealed paddle receiving means 12 as if the paddle in question had been round. Slot 50 corresponds with slot 18 and enables paddle retaining screw 40 to reach the square paddle handle and hold it firmly in place as well. By varying the number and location and shape of adapter rod 48, almost any shaped handle may be accommodated. Also shown are adaptor rod receiving means 60 for receiving removable attaching means 62 which secure adaptor rod 48 inside adaptor 46. Further, paddle securing receiving means 64 are provided for receiving removable paddle securing means 66 for holding square handled (see FIG. 6A) paddle 58 within adaptor 46.

Referring now to FIG. 2, device 10 is shown in partial sectional side view. Paddle 52 is shown supporting a boat 54 of wafers 56. Paddle 52 is shown as locked in place by set screw 40 in spacer 38 with the handle of paddle 52 being totally encapsulated within sealed paddle receiving means 12. Shown from the side are sealing door 32 with attachments 36 holding end 30 of flexible bellows joint section 24 tightly against sealing gasket 34 so that an air tight seal is created. Also, removable attachments 29 are shown holding end 26 of flexible bellows joint section 24 tightly against sealing gasket 28 and retention plate 20 thereby forming an air tight, leak proof seal.

FIG. 3 is a cross section of device 10 taken along the line 3—3 of FIG. 2. Adapter 46 is shown located within sealed paddle means 12 with adapter rod 48 in place. Compression gasket sealing means 37 can be seen in sealing door 32. FIG. 4 is a side view of device 10 showing, by use of phantom lines 32A and 32B, an exaggerated illustration of some of the movement that is possible for sealing door 32 as a result of flexible bellows joint section 24. Because sealing door 32 is able to move, any misalignment of a wafer processing tube, not shown, can be accepted and a perfect, leak proof seal effected, without having to disturb the process tube itself.

FIG. 5 is a top view of sealed paddle receiving means 12 showing indentations 22 near sealed end 14, retention plate 20 and slot 18. Also, a front view of sealed paddle receiving means 12 is shown in FIG. 5A illustrating open end 16, slot 18 indentations 22 and retention plate 20.

FIG. 6 is a partial schematic side view of adapter 46. Illustrated by broken dotted lines is adapter rod 48. Also shown in FIG. 6A is an end view of adapter 46 shown with adapter rod 48 in place, thereby forming a squared, flat, surface against which square paddle handle 58, shown in cross sectional view, may be locked by set screws 66, not shown.

In operation then, a normal round handled paddle, paddle 52, is inserted into totally encapsulated sealed paddle receiving means 12. Paddle 52 is held in place by means of indentations 22 and paddle set screw 40. The purchase for set screw 40 is provided by spacer 38 which also limits the range of motion of the paddle 52 and sealed paddle receiving means 12 as it projects through paddle port 19 in sealing door 32. Because sealing door 32 is enabled of motion in a 360 degree range by means of flexible bellows joint section 24A a complete, air tight seal is insured when sealing door 32 is pressed against a process tube no matter what the location of the process tube may be. This seal is insured even further because of the fact that flexible bellows joint section 24A is also capable of compression so that a compressive force through flexible joint 24 may also be exerted on sealing door 32 and thence to the face of the process tube in question. Because sealing door 32 is sealed by means of gaskets 34 and 28 no gas may enter or escape from the process tube at those locations. It should be noted that none of the gaskets 28, 34 or the gasket 37 at the connection of sealing door 32 with the process tube involve a gasket in direct contact with paddle 52. Instead, paddle 52 is held in place within sealed paddle receiving means 12 which is open at end 16 but completely sealed at end 14. As a result, once the seal is made between sealing door 32 and the process tube, the entire device is positively sealed against any leakage into or out of the process tube. As a further benefit, because the paddle is enveloped within the sealed paddle receiving means 12, an air insulation effect occurs so that the loss of temperature through the paddle handle from the interior of the process tube is minimized or eliminated. This reduction in leakage increases the efficiency of the overall processing and reduces expense while insuring particle-free processing.

If a square handled paddle 58 is utilized, the paddle 58 is inserted into adapter 46. Adapter 46 has adapter rod 48 secured within it which squares off the inner tube thereby making a secure receptacle for the square handled paddle 58. Because slot 50 corresponds with slot 18 in sealed paddle receiving means 12, set screw 40 is also enabled to retain square handled paddle 58 in position. Adapter 46 slides completely within receiving means 12 and the rest of the device is unchanged. In either case, no sealing "O" ring is present about the paddle handle. In fact, because of the unique design of the device, once sealing door 32 is in place, the user has complete confidence that the vacuum seal will be maintained because there is no seal along the handle. Further, by means of the adapter, other shaped handles, rectangular, octagonal or the like, can be adapted as well. The gist of the invention, total encapsulation, will remain unaffected by the shape of the handle. Additionally, because of the adapter, different handles may be accommodated rapidly and easily without disruption of the basic encapsulation system. Thus, the present invention provides an improved door closure mechanism which can be easily manipulated in order to accommodate different handle shapes, which provides total encapsulation of the paddle handle thereby insuring leak proof processing, which provides by way of an added benefit an air insulated barrier thereby reducing waste due to radiation through the handle and hence increasing the efficiency of the processing system. Finally, the total encapsulated door closure device has the important advantage of avoiding sealing means directly attached to the highly heat conductive paddle handles which result, ordinarily, in seal failure and loss of controlled processing.

While the present invention has been disclosed in connection with the preferred embodiment thereof, it should be understood that there may be other embodiments which fall within the sphere and scope of the invention defined by the following claims.

What is claimed is:

1. A door closure apparatus for encapsulating a wafer paddle when said paddle is inserted into a process tube comprising:
    a sealing door means sealable on its inside against the open end of said process tube;
    a flexible bellows joint means sealingly attached to the outside of said sealing door means; and
    a paddle receiving means securely attached and sealed to said flexible joint means, with a first sealed end and a second open end, said open end protruding through said sealing door means and extending from said inside of said door means so that said wafer paddle is supported by said paddle receiving means when said wafer paddle is inserted into said process tube.

2. The apparatus of claim 1 wherein said sealing door means comprises:
    a base plate;
    a compressible sealing means removably attached to said inside of said base plate;
    a paddle port in said plate; and
    a plurality of attachment receiving means surrounding said paddle port on the outside of said base plate.

3. The apparatus of claim 2 wherein said sealing door means is circular in shape.

4. The apparatus of claim 2 wherein said flexible bellows joint means comprises:
    a first end conformed to fit around and seal, by means of a removably insertable sealing gasket means, said paddle port wherein said first end is held in place by a plurality of attachment means secured to said attachment receiving means on said base plate;
    a bellows section which allows for flexing in any direction and which also is compressible; and
    a second end adapted so that it may be secureably attached to said paddle receiving means.

5. The apparatus of claim 4 wherein said paddle receiving means comprises:
    said open end of said paddle receiving means conformed to pass through said paddle port with a slot cut out of the uppermost portion of said open end;
    a retention plate with a plurality of attachment receiving means located on said paddle receiving means between said sealed end and said open end of said paddle receiving means to which a second end of said flexible bellows joint means is securely attached, in conjunction with a removably insertable sealing gasket, by means of said plurality of attachment means and;
    a pair of oppositely positioned detention indentations located near the terminal end of said sealed end of said paddle receiving means for inhibiting rotation of said wafer paddle handle when placed therein.

6. The apparatus of claim 5 further comprising a retaining spacer which conforms to and slips over said open end of said paddle receiving means and which is secured in place about said paddle receiving means by a plurality of removable securing means and which, further, has an opening which corresponds with said slot cut out of the uppermost portion of said open end of said paddle receiving means through which opening a paddle retaining means may be passed.

7. The apparatus of claim 6 further comprising an adapter means wherein said adapter means comprises:
   an elongated tube having first and second open ends, said elongated tube slidably fitted inside said paddle receiving means;
   a slot cut out of said first end of said adapter means which aligns with said slot in said paddle receiving means so that said paddle retaining means may be passed therethrough;
   an adapter rod secureably attached to the inside of said adapter tube so that said paddle inserted therein will be prevented from rotating; and
   a plurality of holes in said adapter tube through said adapter rod so that said paddle may be securely retained in position with removable securing means.

8. A door closure apparatus for encapsulating a wafer paddle when said paddle is inserted into a process tube comprising:
   a sealing door base plate sealable on its inside against the open end of a process tube;
   a compressible sealing means removably attached to said inside of said sealing door base plate;
   a paddle port in said sealing door base plate;
   a plurality of attachment receiving means surrounding said paddle port on the outside of said sealing door base plate;
   a first end of a flexible bellows joint conformed to fit around and seal, by means of a removably insertable sealing gasket means, said paddle port wherein said first end is held in place by a plurality of attachment means secured to said attachment receiving means on said sealing door base plate;
   a bellows section of said flexible bellows joint which allows for flexing in any direction and which also is compressible;
   a second end of said flexible bellows joint adapted so that it may be securely attached to a paddle receiving means,
   said paddle receiving means having an open end conformed to pass through said paddle port with a slot cut out of the uppermost portion of said open end, and further having
   an elongated encapsulating section with a sealed end within which said section said paddle may be placed;
   a retention plate located on the outside of said elongated encapsulating section of said paddle receiving means to which said second end of said flexible bellows joint means is securely attached in conjunction with a removably insertable sealing gasket, by means of a plurality of attachment means;
   a pair of oppositely positioned detention indentations located near the terminal end of said sealed end of said elongated encapsulating section for inhibiting rotation of said wafer paddle when placed therein;
   a retaining spacer which conforms to and slips over said open end of said paddle receiving means and which is secured in place about said paddle means by a plurality of removable securing means and which, further, has an opening which corresponds with said slot cut out of said uppermost portion of said open end of said paddle receiving means through which a paddle retaining means may be passed;
   an elongated adapter tube having first and second open ends, said elongated tube slidably fitted inside said paddle receiving means;
   a slot cut out of said first end of said adapter tube which aligns with said slot in said paddle receiving means so that said paddle retaining means may be passed therethrough;
   an adapter rod securely attached to the inside of said adapter tube so that said paddle inserted therein will be prevented from rotating; and
   a plurality of holes in said adapter tube and through said adapter rod so that said paddle may be securely retained in position with removable securing means.

* * * * *